(12) United States Patent
Holliday et al.

(10) Patent No.: US 10,676,344 B2
(45) Date of Patent: Jun. 9, 2020

(54) PROTECTIVE ENVIRONMENTAL BARRIER FOR A DIE

(71) Applicant: W. L. Gore & Associates, Inc., Newark, DE (US)

(72) Inventors: Andrew J. Holliday, Wilmington, DE (US); William A. Kinder, Wilmington, DE (US); Nathaniel J. Hoover, Willow Street, PA (US)

(73) Assignee: W. L. Gore & Associates, Inc., Newark, DE (US)

( * ) Notice: Subject to any disclaimer, the term of this patent is extended or adjusted under 35 U.S.C. 154(b) by 0 days.

(21) Appl. No.: 15/779,172

(22) PCT Filed: Nov. 30, 2016

(86) PCT No.: PCT/US2016/064093
§ 371 (c)(1),
(2) Date: May 25, 2018

(87) PCT Pub. No.: WO2017/095855
PCT Pub. Date: Jun. 8, 2017

(65) Prior Publication Data
US 2018/0354782 A1    Dec. 13, 2018

Related U.S. Application Data

(60) Provisional application No. 62/261,058, filed on Nov. 30, 2015.

(51) Int. Cl.
*B81B 7/00* (2006.01)
*B81C 1/00* (2006.01)

(52) U.S. Cl.
CPC ........ *B81B 7/0061* (2013.01); *B81C 1/00309* (2013.01); *B81B 2201/0257* (2013.01); *B81C 2203/0109* (2013.01)

(58) Field of Classification Search
CPC .................................................. B81B 7/0061
See application file for complete search history.

(56) References Cited

U.S. PATENT DOCUMENTS

| 6,255,581 B1 | 7/2001 | Reis et al. |
| 2003/0056576 A1 | 3/2003 | Mansky |

(Continued)

FOREIGN PATENT DOCUMENTS

| DE | 197 54 513 A1 | 6/1999 |
| DE | 11 2006 001 844 B4 | 7/2012 |

(Continued)

OTHER PUBLICATIONS

International Search Report and Written Opinion issued for Application No. PCT/US2016/064093 dated Jun. 8, 2017.

*Primary Examiner* — Trang Q Tran
(74) *Attorney, Agent, or Firm* — Greenberg Traurig, LLP

(57) ABSTRACT

An environmental-barrier layer can protect a die or an array of die. A substrate that includes various functional components can be coupled to a porous environmental-barrier layer to form an array of die prior to dividing the array into individual die. The porous environmental-barrier layer can be a layer that includes polymer or fluoropolymer. The porous environmental-barrier layer can also be a filter layer for allowing certain waves to pass through and blocking particles and other debris. The porous environmental-barrier layer can protect each die in the array and the functional components from damage by protecting the die and the functional components from mechanical, electrical, or environmental damage (e.g., contamination by fluid or dust) without impeding a function of the functional components.

9 Claims, 6 Drawing Sheets

(56) References Cited

U.S. PATENT DOCUMENTS

| | | |
|---|---|---|
| 2005/0074954 A1 | 4/2005 | Yamanaka |
| 2007/0207594 A1 | 9/2007 | Tamura |
| 2009/0179317 A1* | 7/2009 | Iida .................... B81C 1/00238 |
| | | 257/685 |
| 2011/0127655 A1* | 6/2011 | Fujii ...................... H01L 23/04 |
| | | 257/664 |
| 2012/0280382 A1* | 11/2012 | Im ....................... H01L 23/3128 |
| | | 257/712 |
| 2013/0263996 A1* | 10/2013 | Holliday ............... B81B 7/0058 |
| | | 156/69 |
| 2014/0048351 A1 | 2/2014 | Banter |
| 2015/0118780 A1 | 4/2015 | Tsai et al. |
| 2015/0143874 A1 | 5/2015 | Hunziker et al. |
| 2018/0134546 A1* | 5/2018 | Oh ........................ B81C 1/0023 |

FOREIGN PATENT DOCUMENTS

| | | |
|---|---|---|
| EP | 1755360 A1 | 2/2007 |
| EP | 2731129 A1 | 5/2014 |
| JP | 2017-060661 A | 3/2007 |
| JP | 2007-235008 A | 9/2007 |
| JP | 2015-518646 A | 7/2015 |
| JP | 2017-184952 A | 10/2017 |
| WO | WO-97/39484 A1 | 10/1997 |
| WO | WO-98/44546 A1 | 10/1998 |
| WO | WO-2013/138286 A1 | 9/2013 |

\* cited by examiner

PROTECTIVE ENVIRONMENTAL BARRIER FOR A DIE

PRIORITY CLAIM

This application is a U.S. National Stage of International Application No. PCT/US2016/064093, filed on Nov. 30, 2016, which claims the priority of U.S. Provisional App. No. 62/261,058, filed on Nov. 30, 2015, the entire contents and disclosures of which is hereby incorporated by reference.

TECHNICAL FIELD

The present disclosure relates generally to integrated circuits. More specifically, but not by way of limitation, this disclosure relates to an environmental-barrier layer for protecting a micro-electro-mechanical system ("MEMS") or nano-electro-mechanical system ("NEMS") die.

BACKGROUND

Micro-electro-mechanical systems ("MEMS") or nano-electro-mechanical systems ("NEMS") can be created on semiconducting material (e.g., a silicon wafer or substrate) by etching, doping, or depositing electronic circuits or components on the semiconducting material. The semiconducting material can include multiple die. A die can be a small block of the semiconducting material on which a functional circuit is fabricated. A wafer or array of die can include a group or a series of individual die. Each die in the wafer can be separated and packaged to be integrated into a device.

Each die can be small or fragile and susceptible to damage from a manufacturing process or an environment in which the die is used. It may be desirable to protect an array of die or a die in the array from damage prior to dicing the array of die or prior to singulating (e.g. separating) the die from the array of die.

SUMMARY

Various embodiments of the present disclosure relate to an environmental-barrier layer (e.g., a porous environmental-barrier layer) for protecting a die.

In one embodiment, an array of die of the present disclosure can be formed by attaching a porous environmental-barrier layer to a substrate (e.g., a silicon substrate) that includes various functional components or features (e.g., an electromechanical transducer) positioned on or embedded in the substrate. The array of die can include a series of individual die. The porous environmental-barrier layer can be coupled to the substrate to cover the entire substrate including the various functional components. The porous environmental-barrier layer can protect each die in the array and the various functional components from damage or from contamination from liquid or dust. The porous environmental-barrier layer may also include a vent and be breathable or selectively permeable for allowing certain intended signals, waves, or substances (e.g., air or pressure waves, chemicals, acoustic signals, gases, etc.) to pass through while protecting the die without impeding a function of the functional component.

In another embodiment, after the array of die is formed, the array can be divided into individual die. Each die can include a portion of the substrate, a portion of the porous environmental-barrier layer, and a functional component. The portion of the porous environmental-barrier layer included in each die can cover the die to protect the die and the functional component from damage or contamination.

In another embodiment, a method of the present disclosure includes forming an array of die by coupling a porous environmental-barrier layer to a substrate that includes functional components. The porous environmental-barrier layer can protect the functional components from damage. The method further includes dividing the array of die into separate individual die after coupling the porous environmental-barrier layer to the substrate. Each individual die can include a portion of the substrate, a functional component, and a portion of the porous environmental-barrier layer. The portion of the porous environmental-barrier layer can cover the die and functional component in the die to protect the die and the functional component from damage.

These illustrative examples are mentioned not to limit or define the scope of this disclosure, but rather to provide examples to aid understanding thereof. Illustrative examples are discussed in greater detail in the Detailed Description that follows. Advantages offered by various embodiments may be further understood by examining this specification or by practicing one or more embodiments of the present subject matter.

DETAILED DESCRIPTION

Figure 1:
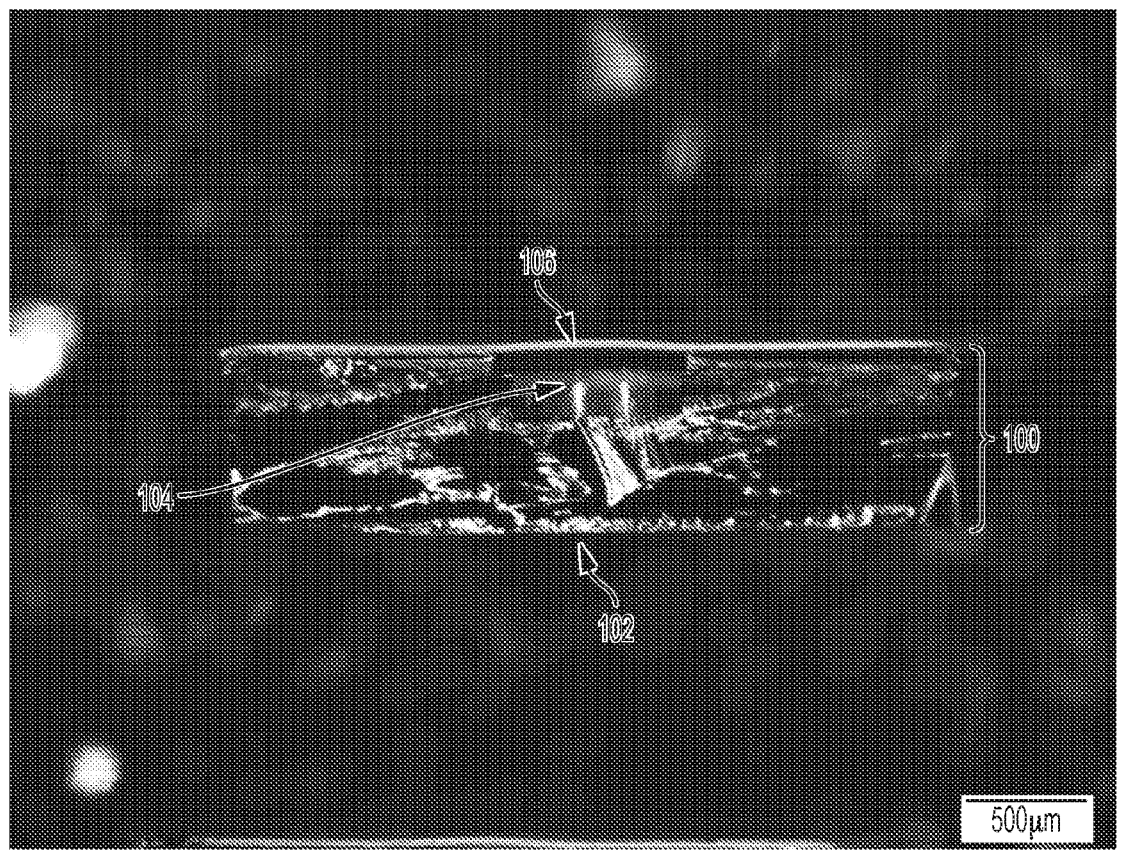
FIG. 1 is a cross-sectional view of an example of a die that includes an environmental-barrier layer coupled to a substrate, according to one example of the present disclosure.

Certain aspects and features of the present disclosure are directed to an environmental-barrier layer for protecting a micro-electro-mechanical system ("MEMS") or nano-electro-mechanical system ("NEMS") die. The die can include a semiconducting material (e.g., a silicon wafer or substrate) coupled to one side of the die. The semiconducting material can include a functional component. The die can also include an environmental-barrier layer coupled to another side of the die. The functional component can be a microphone, a sensor, an electrical component or an electromechanical component. In some examples, the environmental-barrier layer can be a porous layer. The environmental-barrier layer can include a polymer or fluoropolymer, such as, for example, expanded polytetrafluoroethylene ("ePTFE"). The environmental-barrier layer can cover the die to protect the die, along with the functional component, from mechanical, electrical, or environmental damage without impeding the function of the functional component.

For example, a substrate can include various functional components. Each functional component can be positioned on or partially embedded within the substrate. A porous environmental-barrier layer can be bonded to the substrate to form an array of die. The array of die can be a series of functional individual die. In some examples, an adhesive material can be used to bond the porous environmental-barrier layer directly to the substrate to form the array of die. In another example, the porous environmental-barrier layer can be bonded to the substrate using other materials or other techniques. The porous environmental-barrier layer can cover the entire substrate to protect each die in the array of die and the various functional components from damage. The array of die can be attached to dicing tape to be singulated (e.g., divided or cut into individual die) through a dicing step after the porous environmental-barrier layer is bonded to the substrate. Each individual die can include a portion of the substrate, a functional component, and a portion of the porous environmental-barrier layer. The portion of the porous environmental-barrier layer included in each die can protect the die and a functional component included in the die.

The porous environmental-barrier layer can protect die from structural damage when the array of die is singulated into individual die. The porous environmental-barrier layer can also protect the functional component of a die from debris or other damage when the array of die is singulated. In another example, the porous environmental-barrier layer can protect the die, along with the functional component of the die, from being contaminated or damaged by fluid or dust. In some examples, the porous environmental-barrier layer can protect the functional component from damage without impeding a function of the functional component. As an example, if the functional component includes a microphone, the porous environmental-barrier layer can protect the microphone from being contaminated by fluid while allowing sound waves to pass through the porous environmental-barrier layer to reach the microphone. The porous environmental-barrier layer can also protect the die and a functional component of the die during packaging operations, which may include integrating the die into an operating environment (e.g., into a device or other component).

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative examples but, like the illustrative examples, should not be used to limit the present disclosure.

FIG. 1 is a cross-sectional view of an example of a die 100 that includes an environmental-barrier layer 106 coupled to a substrate 102, according to one embodiment. The die 100 can be any material that includes a functional component. The die 100 can include the substrate 102, which can be any material or substance onto which a layer of another material or substance is applied. For example, the substrate 102 can be a silicon wafer substrate. The substrate 102 can include a substrate feature 104, which can be any gap, space, vent, or area that can include a functional component (e.g., a functional component of the die 100). For example, the substrate feature 104 can be a substrate cavity for receiving a functional component. In some examples, the substrate 102 may not include a substrate feature 104 and the functional component may be positioned on or partially embedded within the substrate 102.

The die 100 can also include an environmental-barrier layer 106. The environmental-barrier layer 106 can be a porous layer or a layer that includes a vent. The environmental-barrier layer 106 can also be a woven or non-woven layer. In some examples, the environmental-barrier layer 106 can also be a filter layer or a hydrophobic material that is breathable (e.g., selectively permeable) for allowing certain air or pressure waves to pass through and for blocking particles, fluids, and other debris. In another example, the environmental-barrier layer 106 may filter, absorb, or catalyze a gas. For examples, the environmental-barrier layer 106 may filter, absorb, or catalyze a gas that contacts the environmental-barrier layer 106. The environmental-barrier layer 106 can be of any size, shape, or thickness. As an example, the environmental-barrier layer 106 can have a thickness of 30 μm.

In some examples, the environmental-barrier layer 106 can include a polymer or fluoropolymer. As an example, the environmental-barrier layer 106 can include a microporous fluoropolymer, such as polytetrafluoroethylene ("PTFE"), fluorinated ethylenepropylene ("FEP"), perfluoroalkoxy polymer ("PFA"), polypropylene ("PP"), polyurethane ("PU"), polyethylene ("PE"), or ultra-high molecular weight polyethylene ("UHMWPE"). In other examples, the environmental-barrier layer 106 can include expanded polytetrafluoroethylene ("ePTFE") membranes.

The environmental-barrier layer 106 can be coupled to the substrate 102 for covering the die 100, along with the substrate feature 104. In some examples, the environmental-barrier layer 106 may be positioned near the substrate feature 104 such that the environmental-barrier layer 106 can cover the die 100, along with the substrate feature 104 to protect the die and a functional component in the die 100 from mechanical, electrical, or environmental damage. For example, the environmental-barrier layer 106 can protect the die and the functional component from being contaminated by fluid or dust.

Figure 2:
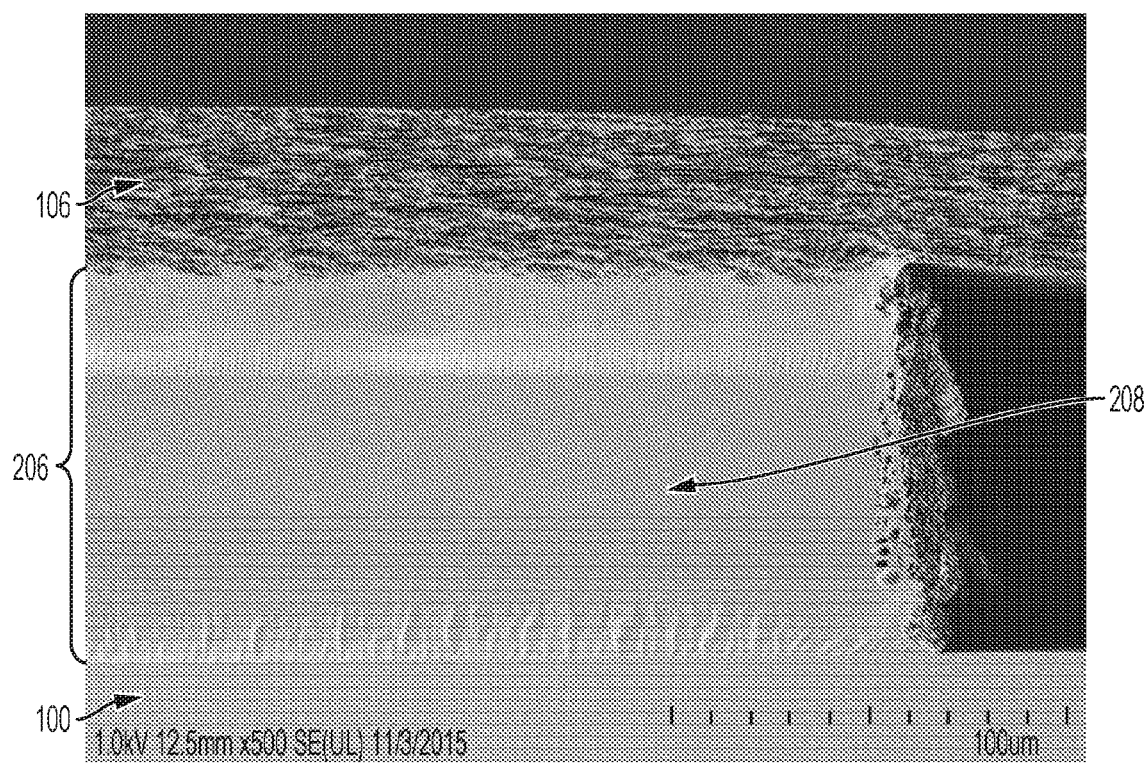
FIG. 2 is a cross-sectional view of the environmental-barrier layer of FIG. 1 coupled to the die of FIG. 1 using an adhesive material, according to one example of the present disclosure.

Environmental-barrier layers can be coupled to substrates that include dies using various techniques. For example, FIG. 2 is a cross-sectional view of the environmental-barrier layer 106 coupled to the die 100 of FIG. 1 using an adhesive material 206, according to one embodiment. The adhesive material 206 can be any material for attaching one material or surface to another material or surface. As an example, the adhesive material 206 can be a double-sided adhesive material having adhesive on a first surface and adhesive on a second surface opposite the first surface. In some examples, the adhesive material 206 can be pressure sensitive adhesive material. The adhesive material 206 can also be any adhesive material that can withstand lead-free solder reflow temperatures. In other examples, the adhesive material 206 can include an adhesive material that cannot withstand lead-free solder reflow temperatures. Examples of the adhesive material 206 include, but are not limited to, epoxy, benzocyclobutene ("BOB"), adhesives used in die bonding, or other adhesives that can be patterned with die manufacturing methods.

In some examples, the adhesive material 206 can include a center carrier 208. The center carrier 208 can be high temperature solution that can be included in the adhesive material 206 if the adhesive material 206 may be exposed to high temperatures. Examples of the center carrier 208 can include, but are not limited to, polyimide ("PI"), polyetheretherketone ("PEEK"), polyamide (PA), or polyarylimide ("PAI"). In some examples, the adhesive material 206 may not include a center carrier 208.

Figure 3:
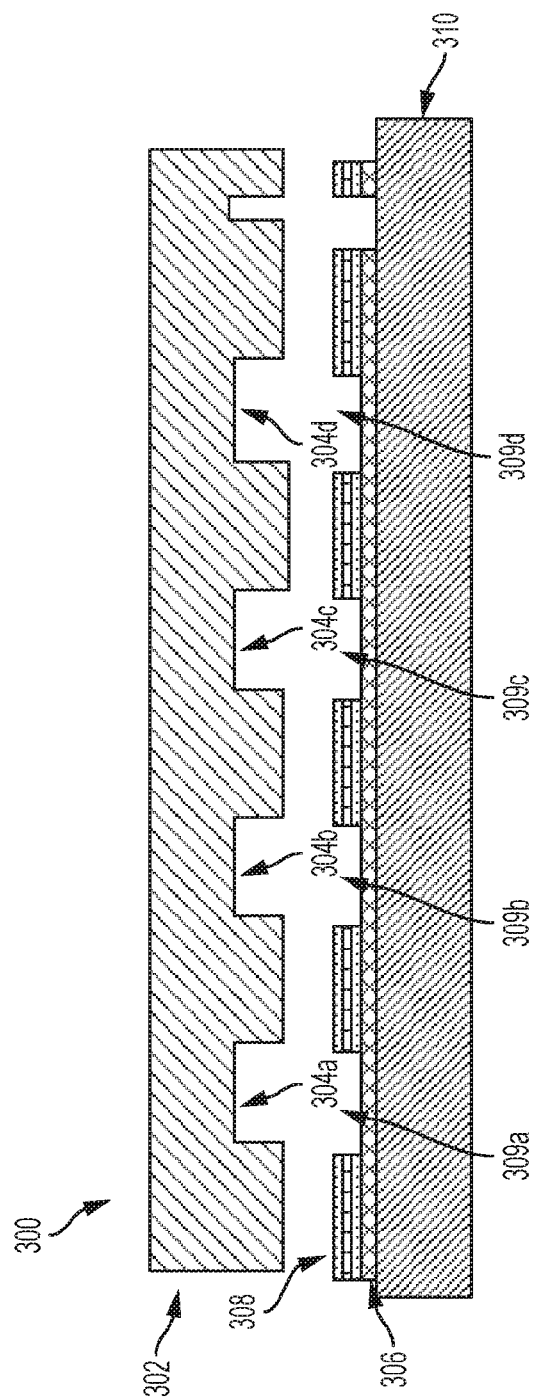
FIG. 3 is a cross-sectional schematic view of an example of an array of die formed by coupling a porous environmental-barrier layer to a substrate using an adhesive material, according to one example of the present disclosure.

Adhesive material can also be used to couple an environmental-barrier layer directly to a substrate to form an array of die. For example, FIG. 3 is a cross-sectional schematic view of an example of an array of die 300 formed by coupling a porous environmental-barrier layer 306 to a substrate 302 using an adhesive material 308, according to one embodiment.

Prior to coupling the porous environmental-barrier layer 306 to the substrate 302, the substrate 302 can include a functional component or feature for performing various functions. For example, the substrate can include substrate features or substrate cavities 304a-d, which can include a functional component prior to coupling the porous environmental-barrier layer 306 to the substrate 302. Examples of functional components include microphones, electromechanical transducers, and chemical, gas, humidity, pressure or other types of sensors. In some examples, each substrate cavity 304a-d can be pre-etched on the substrate 302 for receiving the functional component. In other examples, the substrate 302 may not include substrate cavities 304a-d and a functional component can be deposited or positioned on, or partially embedded within, the substrate 302. For example, the functional component can be built into the substrate 302 as part of a process of etching or depositing various layers of the substrate 302.

The porous environmental-barrier layer 306 can be configured in substantially the same manner as environmental-barrier layer 106 of FIG. 1. For example, the porous environmental-barrier layer 306 can be a porous layer that includes ePTFE or another porous protective layer that can include a polymer or fluoropolymer and can protect the functional component without negatively impacting the function of the functional component.

The adhesive material 308 can be configured in substantially the same manner as adhesive material 206 of FIG. 2. For example, the adhesive material 308 can be double-sided for coupling the substrate 302 to the porous environmental-barrier layer 306. The substrate 302 can be bonded to a first side of the adhesive material 308 that includes an adhesive. The porous environmental-barrier layer 306 can be bonded to a second side of the adhesive material 308 that includes an adhesive.

In some examples, the adhesive material 308 can also include an alignment feature (e.g., an opening, hole, or vent) for bonding the substrate 302 to the first side of the adhesive material 308. For example, the adhesive material 308 can be designed or configured to include openings 309a-d that can act as alignment features for bonding the substrate 302 to the first side of the adhesive material 308. The openings 309a-d can be cut according to any pattern or size. In another example, each opening 309a-d can be cut according to a pattern or size associated with a pattern or size of a substrate cavity on the substrate 302. In the example depicted in FIG. 3, each of the openings 309a-d can be configured according to a pattern or size that correspond to a pattern or size of an associated substrate cavity 304a-d. As an example, opening 309a can be configured according to a size of substrate cavity 304a. As another example, openings 309a-b can be configured according to a pattern that corresponds with the pattern of substrate cavities 304a-b.

The substrate 302 can be bonded to a first side of the adhesive material 308 by aligning the adhesive material 308 with the substrate 302 such that the openings 309a-d are aligned with the substrate cavities 304a-d. The porous environmental-barrier layer 306 can be bonded to a second side of the adhesive material 308 opposite the first side.

Bonding the porous environmental-barrier layer 306 to one side of the adhesive material 308 and bonding the substrate 302 to another side of the adhesive material 308 can couple the substrate 302 to the porous environmental-barrier layer 306 to form the a wafer or array 300. Coupling the substrate 302 to the porous environmental-barrier layer 306 can allow the porous environmental-barrier layer 306 to cover the functional components included in the substrate (e.g., functional components in substrate cavities 304a-d) to protect the functional components from damage.

In some examples, a polyethylene terephthalate film ("PET") 310 can be used when coupling the substrate 302 to the porous environmental-barrier layer 306. For example, the PET 310 can be used to maintain the rigidity of the porous environmental-barrier layer 306 and the substrate 302 when forming the array 300. In another example, any stiff layer or material (e.g., a glass or a blank silicon substrate) can be used to maintain the rigidity of the porous environmental-barrier layer 306 and the substrate 302 when forming the array 300.

In some examples, the substrate 302 or the adhesive material 308 can be patterned or configured after the substrate 302 is bonded to the porous environmental-barrier layer 306. In such examples, the adhesive material 308 may not include alignment features (e.g., openings 309a-d). In some examples, where the adhesive material 308 or the substrate 302 is patterned after the substrate 302 is bonded to the porous environmental-barrier layer 306, Pet 310 or another stiff layer or material may not be used to maintain the rigidity of the array 300.

Figure 4:
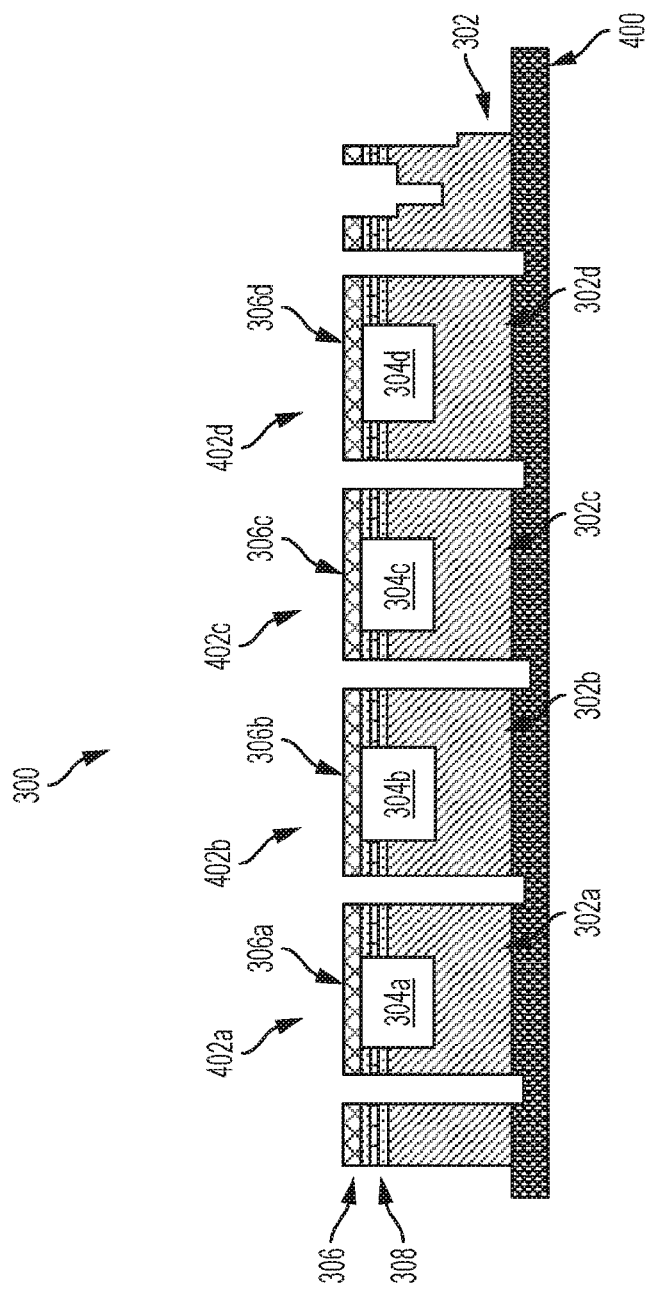
FIG. 4 is a cross-sectional schematic view of an example of individual die formed from an array of die, according to one example of the present disclosure.

After forming the array 300, individual die can be formed from the array 300. For example, FIG. 4 is a cross-sectional schematic view of an example of individual die 402a-d formed from an array of die 300, according to one embodiment.

In some examples, the array 300 can be formed by coupling a substrate 302 to a porous environmental-barrier layer 306. The array 300 can include a series of functional individual die 402a-d. The array 300 can be singulated to form separate individual die 402a-d. For example, the array 300 can attached to or mounted on tape 400. The tape 400 can be dicing tape (e.g., backing tape used during substrate dicing). As an example, the tape 400 can be UV dicing tape. After the array 300 is mounted on tape 400, various methods and techniques can be used to singulate the array 300 to form individual die 402a-d including, for example, mechanical sawing or stealth dicing. Mechanical sawing can involve using a dicing saw to cut the array 300 into individual die 402a-d. Stealth dicing may involve applying a laser beam or a series of laser beams to the array 300 to cut the array 300 into individual die 402a-d.

Each die 402a-d can include a portion of the substrate 302 used to form the array 300. For example, die 402a can include a portion 302a of the substrate 302. Die 402b can include another portion 302b of the substrate 302. In some examples, each die 402a-d can also include a functional component or feature (e.g., in the substrate cavities 304a-d). For example, die 402a can include a substrate cavity 304a, which may include a functional component.

Each die 402a-d can also include a porous environmental-barrier layer portion 306a-d. Each porous environmental-barrier layer portion 306a-d may contact a corresponding substrate cavity 304a-d. Each porous environmental-barrier layer portion 306a-d may cover each die 402a-d and a corresponding substrate cavity 304a-d. For example, die 402a can include a porous environmental-barrier layer portion 306a, which can cover die 402a, along with substrate cavity 304a. As another example, die 402b can include porous environmental-barrier layer portion 306b, which can cover die 402b and substrate cavity 304b. The porous environmental-barrier layer portions 306a-d can protect the die 402a-d, along with substrate cavities 304a-d, from mechanical, mechanical, electrical, or environmental damage. For example, the porous environmental-barrier layer portions 306a-d can protect the die 402a-d and corresponding substrate cavities 304a-d from being contaminated by fluid or dust. In another example, the porous environmental-barrier layer portions 306a-d may filter, absorb, or catalyze a gas that contacts the porous environmental-barrier layer portions 306a-d.

Each porous environmental-barrier layer portion 306a-d can also protect the corresponding die 402a-d and substrate cavities 304a-d from damage without impeding a function of a functional component in the substrate cavities 304a-d. For example, substrate cavity 304a may include a functional component that is a microphone for sensing sound waves. The porous environmental-barrier layer portion 306a can block dust or fluid from entering the substrate cavity 304a while allowing sound waves to traverse the porous environmental-barrier layer portion 306a to reach the microphone. As another example, substrate cavity 304b can include a functional component that is a pressure sensor. The porous environmental-barrier layer portion 306b may prevent particles from entering the substrate cavity 304b while allowing pressure waves to traverse the porous environmental-barrier layer portion 306b to reach the pressure sensor in the substrate cavity 304b.

Each die 402a-d can be separated from the array 300 and packaged to be integrated into a device or other component. For example, wafer dicing equipment (e.g., an apparatus, device, machine, or the like) can be used to singulate or separate each die 402a-d from the array 300. Die attaching equipment can be used to place each die 402a-d into a MEMS or NEMS package to form a surface mount device that includes a die 402a-d. A surface-mount technology ("SMT") machine can be used to attach the surface mount device to a printed circuit board ("PCB") substrate. In some examples, a PCB board including a surface mount device that includes a die 402a-d can be assembled or integrated into a device.

Figure 5:
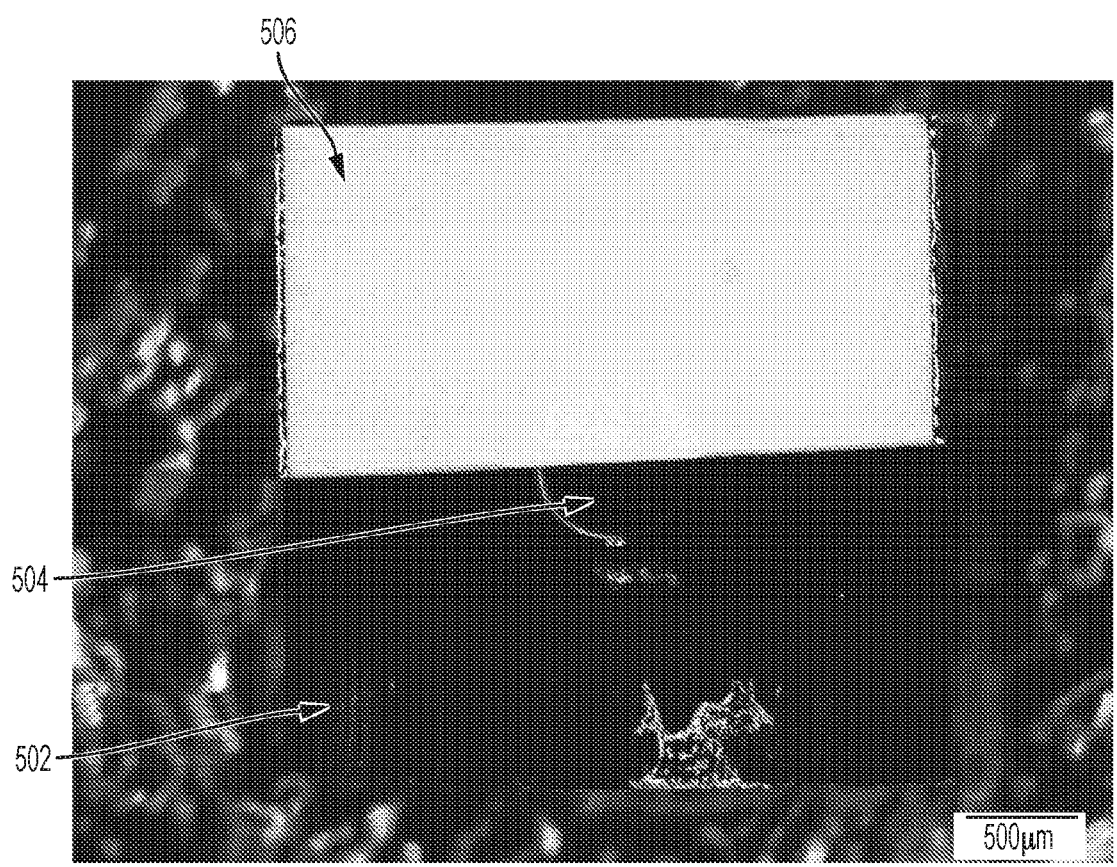
FIG. 5 is a top view of an example of a die formed from an array of die and with part of a porous environmental-barrier layer removed, according to one example of the present disclosure.

FIG. 5 is a top view of an example of a die 502 formed from an array of die and with part of a porous environmental-barrier layer 506 removed, according to one embodiment. In the example depicted in FIG. 5, the die 502 can be cut from an array of die (e.g., the array 300 of FIGS. 3-4). The die 502 can include a substrate cavity 504, which can be configured in substantially the same manner as any of the substrate cavities 304a-d in FIGS. 3-4. The porous environmental-barrier layer 506 can cover the die 502, along with the substrate cavity 504 to protect the die 502 and the substrate cavity 504. The porous environmental-barrier layer 506 can be configured in substantially the same manner as the porous environmental-barrier layer 306 in FIGS. 3-4. In the example depicted in FIG. 5, the porous environmental-barrier layer 506 has been peeled back or partially removed to show the substrate cavity 504 and the die 502. In other examples, the porous environmental-barrier layer 506 can cover the entire die 502 and the substrate cavity 504.

Figure 6:
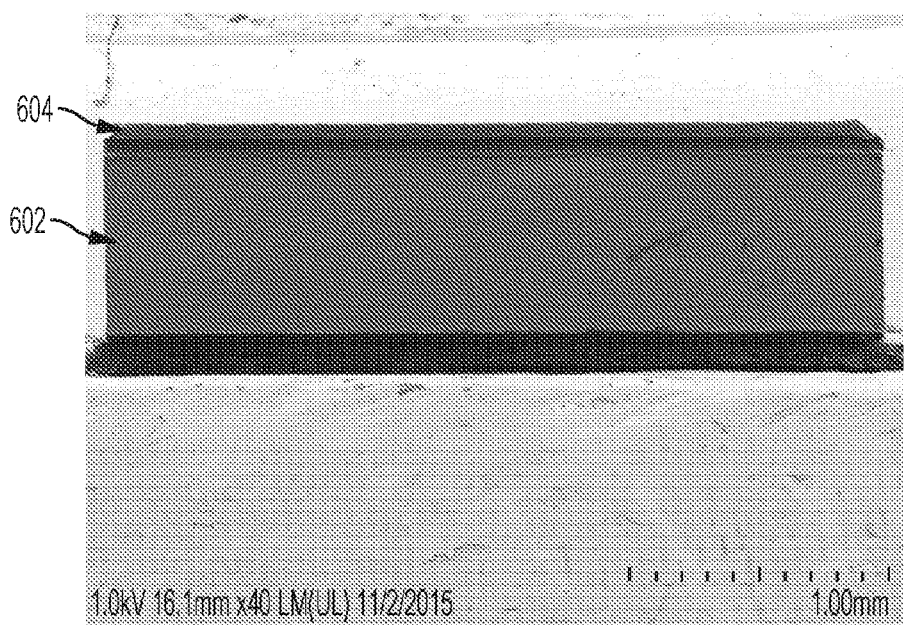
FIG. 6 is a side view of a die mechanically diced from an array of die, according to one example of the present disclosure.

FIG. 6 is a side view of a die 602 mechanically diced from an array of die, according to one embodiment. In the example depicted in FIG. 6, a porous environmental-barrier layer 604 can cover the entire die 602. The porous environmental-barrier layer 604 can be configured in substantially the same manner as the porous environmental-barrier layer 306 of FIGS. 3-4

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. An apparatus comprising:
an array of dies comprising:
a substrate comprising a plurality of substrate cavities, and a plurality of functional components, wherein each substrate cavity contains a functional component therewithin; and
a porous barrier layer coupled to the substrate, by an adhesive material;
wherein the porous barrier layer covers the substrate and protects the plurality of functional components, and wherein the adhesive material comprises a plurality of adhesive openings, wherein each adhesive opening is aligned with a corresponding substrate cavity;
wherein the array of dies is configured to be divided into a plurality of dies,
wherein the porous barrier layer is a filter layer comprising expanded polytetrafluoroethylene ("ePTFE"),
wherein the filter layer is configured to protect the plurality of functional components by preventing passage of fluids, dust or any combination thereof,
wherein each die of the plurality of dies comprises a portion of the substrate, wherein each portion of the substrate comprises:
a substrate cavity with a corresponding functional component, of the plurality of functional components, therewithin and
a portion of the porous barrier layer
wherein each portion of the porous barrier layer covers the corresponding functional component.

2. The apparatus of claim 1, wherein the porous barrier layer is configured to be positioned proximate to the substrate cavities such that the porous barrier layer covers the substrate cavities and is in contact with the substrate cavities,
wherein the porous barrier layer is configured to prevent passage of fluids or dust and configured to allow passage of a pressure wave.

3. The apparatus of claim 1, wherein each die is configured to be attached to a printed circuit board ("PCB") after the die is packaged.

4. The apparatus of claim 1 wherein the adhesive material includes an adhesive, epoxy, or benzocyclobutene ("BCB").

5. The apparatus of claim 1, wherein the adhesive material comprises polyimide ("PI"), polyetheretherketone ("PEEK"), polyamide (PA), or polyarylimide ("PAI").

6. A die comprising:
a substrate comprising a substrate cavity having a functional component therewithin; and
a porous barrier layer coupled to the substrate;
wherein the porous barrier layer covers the functional component and protects the functional component,
wherein the porous barrier layer is a filter layer comprising expanded polytetrafluoroethylene ("ePTFE"), wherein the filter layer is configured to protect the functional component by preventing passage of fluids, dust, or any combination thereof, wherein the die is a portion of an array of dies, the array of dies comprising:

a substrate comprising a plurality of substrate cavities, and a plurality of functional components, wherein each substrate cavity contains a corresponding functional component therewithin; and a porous barrier layer coupled to the substrate, by an adhesive material;

wherein the porous barrier layer covers the substrate and protects the plurality of functional components, and wherein the adhesive material comprises a plurality of adhesive openings, wherein each adhesive opening is aligned with a corresponding substrate cavity.

7. The die of claim 6, wherein the porous barrier layer is configured to protect the functional component, configured to prevent passage of fluids or dust and, and configured to allow passage of a pressure wave.

8. The die of claim 6, wherein the die is configured to be attached to a printed circuit board ("PCB") after the die is packaged.

9. The die of claim 6, wherein the functional component includes a microphone, a sensor, a circuit, a resistor, a capacitor, an inductor, or a transistor.

* * * * *